(12) United States Patent
Dalton et al.

(10) Patent No.: US 7,196,014 B2
(45) Date of Patent: Mar. 27, 2007

(54) SYSTEM AND METHOD FOR PLASMA INDUCED MODIFICATION AND IMPROVEMENT OF CRITICAL DIMENSION UNIFORMITY

(75) Inventors: Timothy J. Dalton, Ridgefield, CT (US); Ronald A. Della Guardia, Poughkeepsie, NY (US); Nicholas C. Fuller, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 10/983,345

(22) Filed: Nov. 8, 2004

(65) Prior Publication Data

US 2006/0099816 A1    May 11, 2006

(51) Int. Cl.
*H01L 21/311* (2006.01)
(52) U.S. Cl. .................................... 438/700; 438/725
(58) Field of Classification Search ................. 438/637, 438/700, 702, 704, 706, 714, 723, 725
See application file for complete search history.

(56) References Cited

U.S. PATENT DOCUMENTS

| 5,607,542 | A | 3/1997 | Wu et al. | |
| 5,994,233 | A | 11/1999 | Chen et al. | |
| 6,562,544 | B1 * | 5/2003 | Cheung et al. | 430/313 |
| 6,620,335 | B1 | 9/2003 | DeOrnellas et al. | |
| 6,653,734 | B2 * | 11/2003 | Flanner et al. | 257/758 |
| 6,660,127 | B2 | 12/2003 | Nallan et al. | |
| 6,753,117 | B2 * | 6/2004 | Lu | 430/30 |
| 2003/0027080 | A1 * | 2/2003 | Lu | 430/313 |
| 2005/0101126 | A1 * | 5/2005 | Wagganer et al. | 438/637 |
| 2005/0221019 | A1 * | 10/2005 | Baik et al. | 427/487 |
| 2005/0277289 | A1 * | 12/2005 | Wagganer et al. | 438/637 |

* cited by examiner

*Primary Examiner*—Kin-Chan Chen
(74) *Attorney, Agent, or Firm*—Scully, Scott, Murphy & Presser, P.C.; Robert M. Trepp, Esq.

(57) ABSTRACT

Novel interconnect structures possessing a OSG or polymeric-based (90 nm and beyond BEOL technologies) in which advanced plasma processing is utilized to reduce post lithographic CD non-uniformity ("line edge roughness") in semiconductor devices. The novel interconnect structure has enhanced liner and seed conformality and is therefore capable of delivering improved device performance, functionality and reliability.

13 Claims, 5 Drawing Sheets

Severe CD
Non-Uniformity
(Line Edge Roughness)

Reduced CD
Non-Uniformity
(Line Edge Roughness)

FIG. 5

TABLE I

| WAFER ID | ETCH PROCESSING CONDITION | NUETRAL TO ION FLUX RATIO | LER IMPROVEMENT |
|---|---|---|---|
| SAA | 400mT/500W$_{27}$/100W$_2$/300Ar/50N$_2$/52s | "NEGLIGIBLE" | −28% |
| GSA | 400mT/500W$_{27}$/100W$_2$/200Ar/150N$_2$/48s | "INTERMEDIATE" | −18% |
| H3A | 400mT/500W$_{27}$/100W$_2$/50Ar/300N$_2$/60s | "SIGNIFICANT" | +19% |

SYSTEM AND METHOD FOR PLASMA INDUCED MODIFICATION AND IMPROVEMENT OF CRITICAL DIMENSION UNIFORMITY

BACKGROUND OF THE INVENTION

1. Field of the Invention

The present invention generally relates to integrated circuits (ICs), and more particularly to interconnect structures, including multilevel interconnect structures, in which an advanced plasma process is utilized to enable a reduction of critical dimension non-uniformity post lithographic processing; thus improving liner and Cu seed conformality for desired device/interconnect performance, reliability, and functionality.

2. Description of the Prior Art

Generally, semiconductor devices include a plurality of circuits which form an integrated circuit including chips (e.g., chip back end of line, or "BEOL"), thin film packages and printed circuit boards. Integrated circuits can be useful for computers and electronic equipment and can contain millions of transistors and other circuit elements that are fabricated on a single silicon crystal substrate. For the device to be functional, a complex network of signal paths will normally be routed to connect the circuit elements distributed on the surface of the device. Efficient routing of these signals across the device can become more difficult as the complexity and number of integrated circuits are increased. Thus, the formation of multi-level or multi-layered interconnection schemes such as, for example, dual damascene wiring structures, have become more desirable due to their efficacy in providing high speed signal routing patterns between large numbers of transistors on a complex semiconductor chip. Within the interconnection structure, metal vias run perpendicular to the silicon substrate and metal lines run parallel to the silicon substrate.

Presently, interconnect structures formed on an integrated circuit chip consists of at least about 2 to 8 wiring levels fabricated at a minimum lithographic feature size designated about 1× (referred to as "thinwires") and above these levels are about 2 to 4 wiring levels fabricated at a width equal to about 2× and/or about 4× the minimum width of the thinwires (referred to as "fatwires"). In one class of structures, the thinwires are formed in a low dielectric constant (κ) organosilicate (SiCOH) or polymeric dielectric inter-level dielectric (ILD) layer, and the fatwires are made in a silicon dioxide ILD having a dielectric constant of about 4.0. FIG. 1 depicts a cross-sectional view of a conventional 5-level metal BEOL interconnect structure showing two thinwire and three fatwire levels.

One of the many challenges associated with the fabrication of the thinwires for 90 nm and beyond CMOS BEOL technologies is the reliable printing of ground rule features (≦140 nm) using 193 nm lithography. To enable lithographic processing in this regime Si-containing resist materials have been and are being considered. These materials, however, while capable of achieving target feature sizes for the 90 nm and beyond (e.g., 45 nm line thicknesses) BEOL technology nodes, have severe issues with post lithographic CD non-uniformity or so-called "line edge roughness" (LER). FIG. 2 is a CD SEM image of an example 200 mm 65 nm node $M_1$ comb serpentine structure (post lithography) utilizing a Si-containing resist material and depicts a severe CS non-uniformity (LER). Such post lithographic image roughness or LER is readily transferred during via or trench creation (plasma etch processing); rendering liner and seed conformality difficult. From a lithography perspective, there are a few options available to address such LER for a specific resist material. These might entail changing the resist material formulation to increase photoacid diffusion or adjusting the molecular weight of the polymer. However, since these changes also affect the lithographic capability of the resist, the most common attempts to reduce LER involve post lithography processes such as a post-development bake to flow the resist and smooth the edges, using a resist overcoat, or more complex processes where very thin films of polymers are chemically bound to the resist surface in an attempt to smooth the roughness.

Typically, however, if there is severe LER post lithography for a given resist material, the aforementioned techniques only manage to achieve minimal improvement in CD uniformity.

It would be highly desirable to provide a BEOL interconnect structure of, e.g., the dual damascene type, in which an advanced plasma process is utilized to reduce post lithographic CD non-uniformity ("line edge roughness") in both via and trench structures for potentially multiple OSG or polymeric-based ILD materials.

It would further be highly desirable to provide a BEOL interconnect structure in which there is improved liner and seed conformality on ILD sidewalls.

It would further be highly desirable to provide a BEOL interconnect structure of improved device and BEOL interconnect functionality, reliability, and performance.

SUMMARY OF THE INVENTION

It is thus an object of the present invention to provide a BEOL interconnect structure of, e.g., the dual damascene type, in which an advanced plasma process is utilized to reduce post lithographic CD non-uniformity ("line edge roughness") in both via and trench structures for potentially multiple OSG or polymeric-based ILD materials.

It is another object of the present invention to provide a BEOL interconnect structure in which there is improved liner and seed conformality on ILD sidewalls.

It is a further object of the present invention to provide a BEOL interconnect structure of improved device and BEOL interconnect functionality, reliability, and performance.

In keeping with these and other objects of the present invention, there is provided an interconnect structure built in low-κ dielectric film in which an advanced plasma process is utilized to reduce post lithographic CD non-uniformity and, thus, improve device/BEOL interconnect performance, reliability, and functionality.

Furthermore, according to the invention, there is provided a method for improving critical dimension (CD) uniformity of post lithographic structure comprising the step of implementing a dual frequency capacitive (DFC) plasma etch process for etching a post lithographic structure at process conditions adapted to reduce the root-mean-square (RMS) line edge roughness (LER) of the resulting post lithographic structure. The DFC plasma process utilized in fabricating the structure is such that the rate of chemisorption of reactive species onto the material surface >> the rate of sputtering of volatile adsorbates from the former surface (i.e. defined as a "significant" neutral to ion flux ratio) facilitating increased etch isotropy and hence reduced CD non-uniformity.

The DFC plasma etch process conditions are adapted to reduce RMS LER of the resulting post lithographic structure by 19% or greater and, is capable of reducing the RMS LER of the resulting post lithographic structure to a value of about 11 nm or less.

Advantageously, the DFC plasma etch process adapted for achieving a significant neutral to ion flux ratio is implemented for 90 nm and beyond BEOL, FEOL and MOL technologies (193 nm and future lithography) in which advanced plasma processing is utilized to reduce post lithographic CD non-uniformity LER in semiconductor devices. A resulting BEOL interconnect structure (e.g., trench or via) has enhanced liner and seed conformality and is therefore capable of delivering improved device performance, functionality and reliability.

BRIEF DESCRIPTION OF THE DRAWINGS

Further features, aspects and advantages of the structures and methods of the present invention will become better understood with regard to the following description, appended claims, and accompanying drawings where:

DETAILED DESCRIPTION OF THE PREFERRED EMBODIMENTS

The present invention is directed to an interconnect structure useful for forming a semiconductor device, the interconnect structure fabricated in an OSG or polymeric-based low-k ILD material such that post lithographic CD non-uniformity ("line edge roughness" or LER) is significantly reduced by tailoring the employed plasma process (e.g., for Via or Trench level) to etch an organic ARC layer; thus, facilitating improved device performance, functionality, and reliability.

Figure 1:
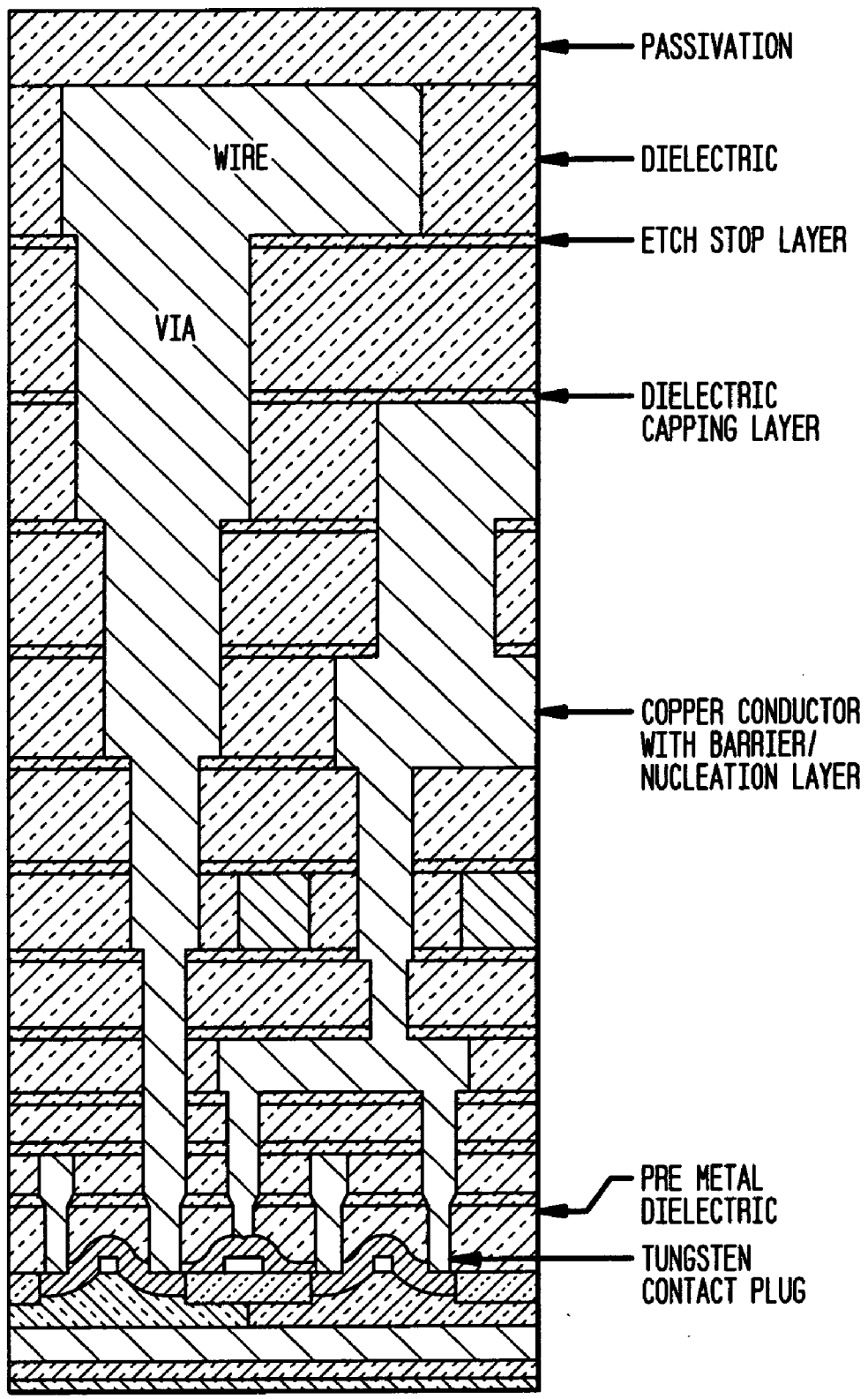
FIG. 1 illustrates a cross-sectional view of a conventional 5-level metal BEOL interconnect structure 10.
Figure 2:
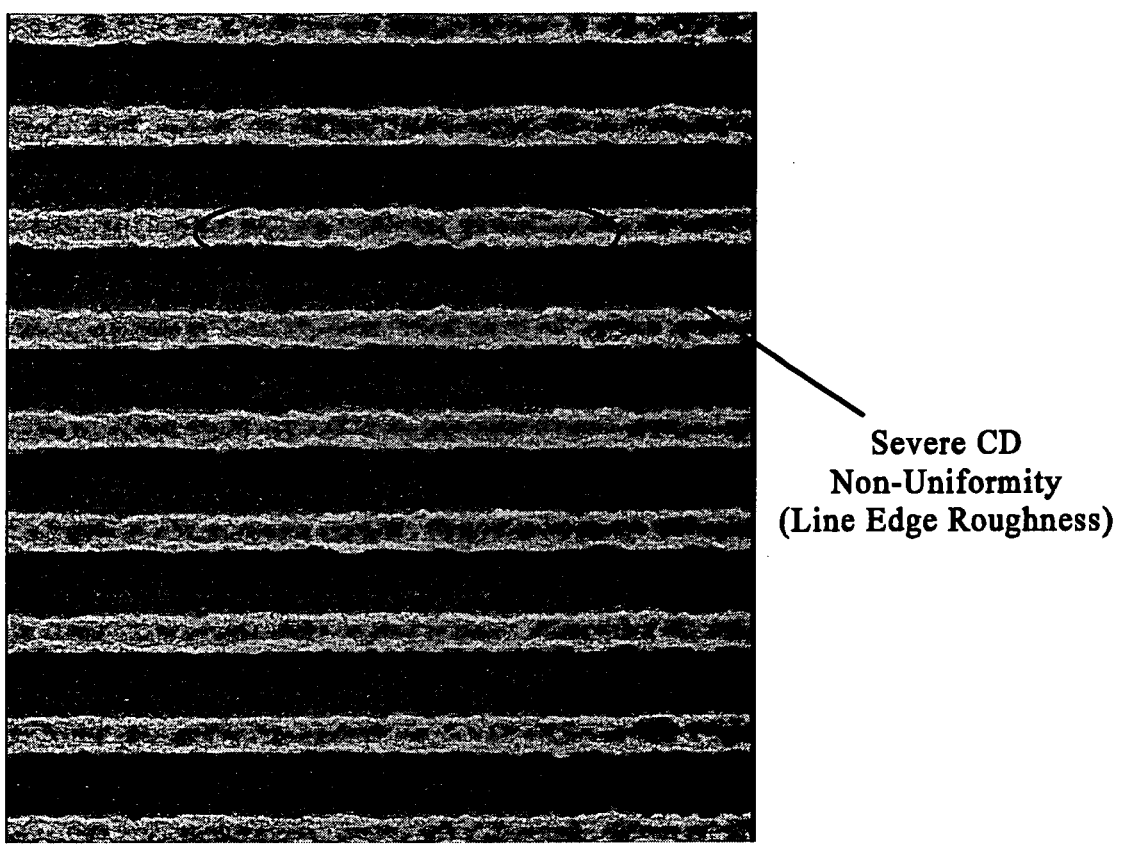
FIG. 2 is a CD SEM image of a 200 mm 65 nm Node $M_1$ Comb Serpentine Structure Post Lithography Utilizing a Si-containing resist material.
Figure 4:
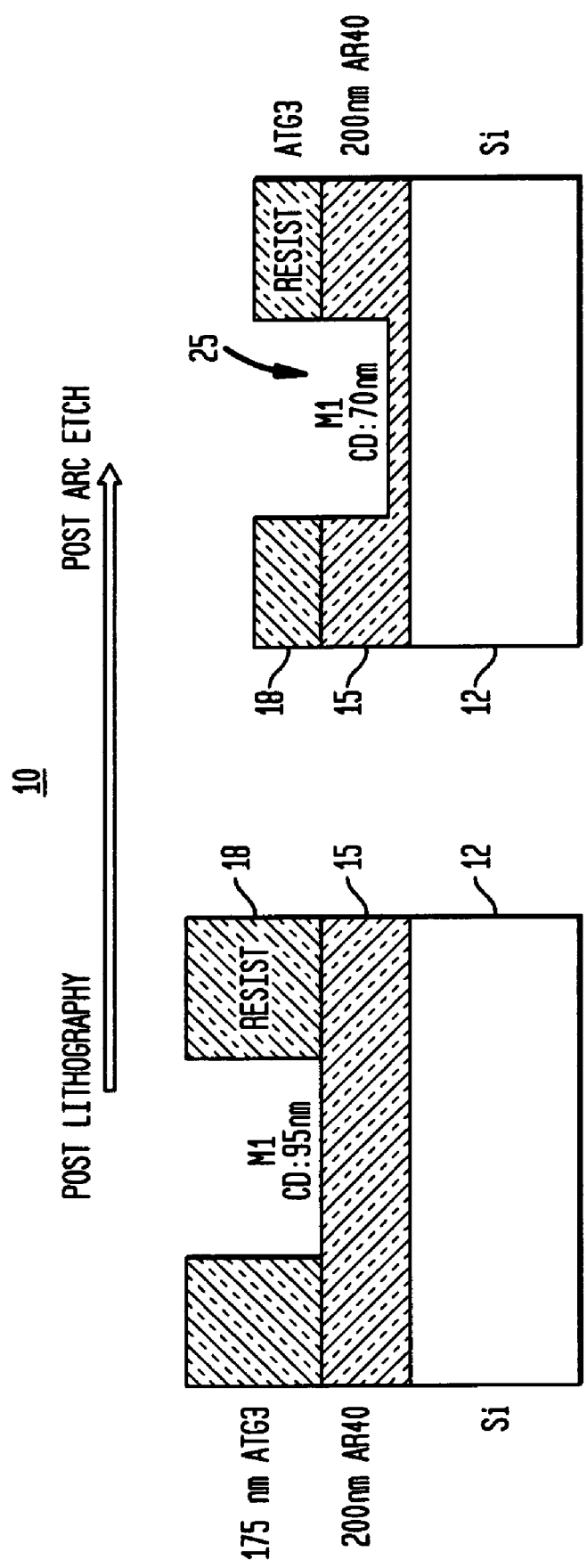
FIG. 4 is a schematic of test structure comprised of 200 mm 65 nm Node $M_1$ lithography (193 nm Si-containing resist material)/200 nm AR 40 ARC/Si Substrate post lithography and post ARC etch processing; and, FIG. 5 is a table showing percentage improvement in LER for various exemplary applied ARC etch chemistries that span the full process parameter space ("Negligible" to "Significant" neutral to ion flux ratio).

As known, a plasma etch process utilizes a plasma comprising a combination of ion and neutrals (atomic or molecular species) that chemically combine with the material to be etched, typically, a non-volatile material such as an organic anti-reflective coating (ARC) material including carbon, hydrogen and oxygen. It is understood that the ARC material may comprise a CVD ARC, or a combination of CVD and organic spin-on ARC. During plasma etch, the neutrals chemically combine with the coating to increase the volatility of the reacted material (i.e., form highly volatile adsorbants) that enables increased etch rates when the material is bombarded or impacted with positive ions of the plasma, for example. As will be described in greater detail herein, FIG. 4 depicts an example process illustrating application of a thin ARC coating (e.g., 200 nm of AR40) prior to performing the lithography step. While dry etch processes (such as plasma etching) are more anisotropic (in the normal plane or vertical direction), as compared to wet etch process, it is desirable to tailor the dry etch process to increase the degree of isotropy. Thus, according to the invention, the plasma etch process still performs a significant degree of vertical etch (anisotropic), however, further achieves a minimum degree of lateral etching (along the horizontal plane), i.e., the degree of isotropy is increased. This small measure of horizontal etch in the plasma process of the invention tends to reduce the amount of "jaggedness" in the resulting line profile (shown in FIG. 2) thus reducing the resulting CD non-uniformity LER in the post-lithography step.

Figure 3:
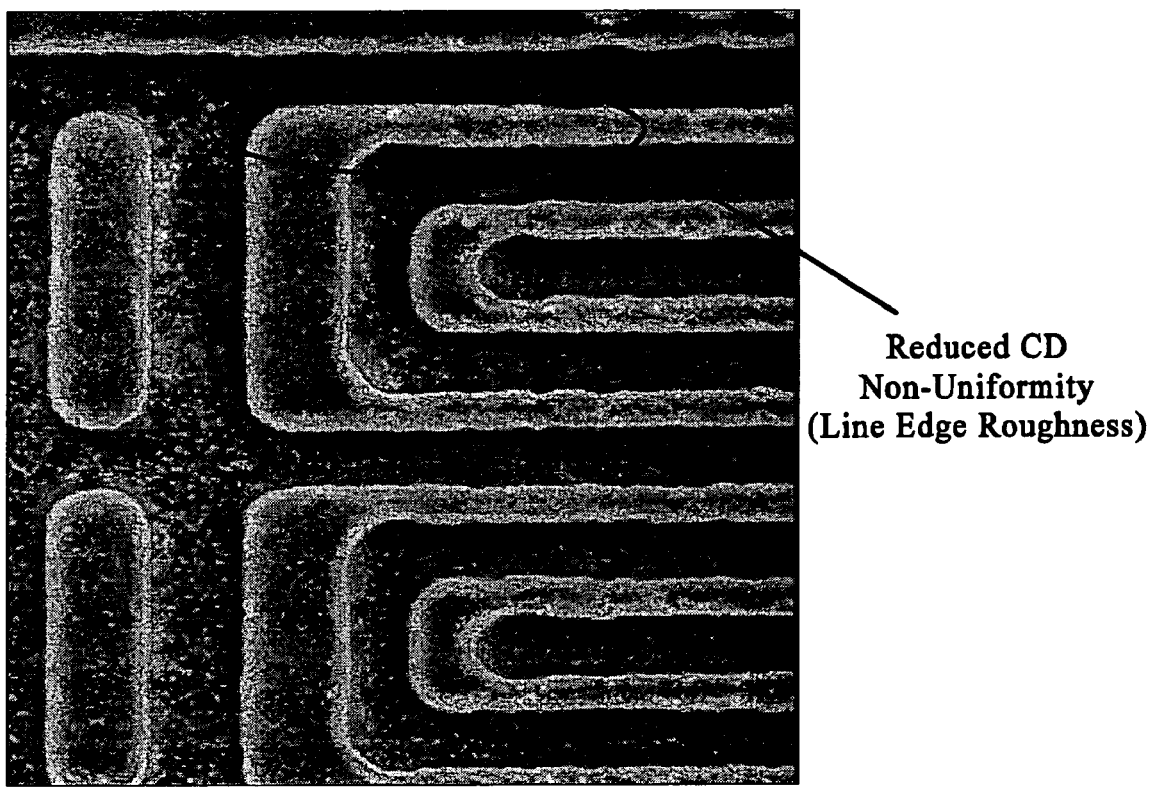
FIG. 3 is a CD SEM image of a 200 mm 65 nm Node $M_1$ Comb Serpentine Structure Post Etch Processing of the ARC material using an etch process with a "Significant" Neutral to Ion Flux ratio.

More particularly, according to the invention, a specific and tailored plasma process is used to substantially reduce the post lithographic CD non-uniformity LER and, thus, enable increased Cu and liner seed conformality and ensuring device/interconnect performance, reliability, and functionality. The first processing step in etching a via or trench stack typically entails etching an organic anti-reflective coating (ARC) layer utilizing $N_2$, $H_2$, and/or $O_2$— including chemistries previously applied to the wafer surface. It is understood that the ARC layer may comprise organic material such as AR40 or, a Silicon-containing material. Occasionally, trace amounts of $CH_3F$ or other polymerizing gases ($CH_2F_2$, $CHF_3$) may be added for sidewall protection and/or CD control. As the post lithographic CD non-uniformity is significant as shown in the CD SEM image of FIG. 2, an $Ar/N_2/H_2/CH_3F$ mixture for a plasma-assisted etch is employed—with specific conditions as described in greater detail herein with respect to FIG. 5—to achieve improved CD uniformity, e.g., within the level-1 metal trench walls. Reduction in LER is made feasible by utilizing a plasma process of "Significant" neutral (rate of chemisorption) to ion (rate of sputtering) flux ratio. Since the degree of etch anisotropy varies indirectly with the neutral to ion flux ratio, as the neutral to ion flux ratio is increased (commensurate with a decreased etch rate of the ARC layer), there is increased etch isotropy and, in particular, lateral etching of the ARC layer. This lateral etching facilitates a reduction in the post lithographic "line edge roughness" as is shown in the CD SEM image in FIG. 3. FIG. 3 particularly depicts a CD SEM image of an example 200 mm 65 nm node $M_1$ comb serpentine structure post-etch processing of the ARC material using an etch process with a significant neutral to ion flux ratio.

FIG. 4 depicts an example post lithographic test structure 10 fabricated to examine the effect of etch process on CD non-uniformity (LER). The test structure depicts deposition of a "thick" ARC layer (e.g., 200 nm) 15 on top of a Si substrate 12 subsequently followed by printing a $M_1$ 65 nm node pattern (180 nm pitch) utilizing a Si-containing resist material 18 and a test reticle. After applying, patterning and developing the resist layer 18, multiple samples were produced in this manner and the RMS (Root Mean Square) LER associated with each sample was determined post lithography using a specific algorithm. In the algorithm implemented, multiple scans (e.g., about 64 scans) were made across the width of a resist image over a fixed length. The mean width for each scan was determined and a one sigma deviation calculated. The LER numbers set forth in the table of FIG. 5 are the 1-sigma deviation from the mean linewidth).

EXAMPLES

Three etching conditions (normalized for etch rate differences) are highlighted in FIG. 5 that depicts a table showing percentage improvement in LER for various applied ARC etch chemistries that span the full process parameter space. Each of these three conditions were employed to etch the 200 nm thick ARC layer (shown in FIG. 4) to span the full process parameter space, namely: from "Negligible" (High Etch Rate, High Degree of Etch Anisotropy, and Low Degree of Etch Isotropy) to "Significant" Neutral to Ion Flux Ratio (Low Etch Rate, Low Degree of Etch Anisotropy, and High Degree of Etch Isotropy). The LER associated with each sample was subsequently measured post etch processing and the consequent change in LER (post Lithographic Processing LER—post Etch Processing LER) as a percentage was then determined.

The data obtained is summarized in Table I (FIG. 5) for each of the three employed etching conditions. It is relevant to note that the "Significant" neutral to ion flux ratio condition achieved the most reduction in LER of all three applied conditions with the plasma process reducing post lithographic LER by as much as 19% to $\leq 11$ nm RMS value. Ideally, a plasma etch process according to the invention may be configured to reduce post lithographic LER to anywhere between $0<\text{LER}\leq 11$ nm RMS value. That is, current 193 nm resists are yielding a LER of approximately 5–6 nm, which is much better than ATG3. It is at least possible to achieve a 0.5 nm 1 sigma LER post etch using the technique of the invention.

FIG. 4 illustrates the resulting post-etch trench 25 (after lithography) formed in the test structure 10. As shown, the resulting structure has uniform line width variation.

Achievement of the "significant" neutral to ion flux ratio condition for obtaining the most reduction in LER in the example embodiment described herein with respect to FIGS. 4 and 5, corresponds, but is not limited to, the following plasma etch process conditions: a first power feed 27 MHz (source)/2 MHz (bias) in Dual Frequency Capacitive (DFC) platform: 400 mT (pressure)/500 $W_{27}$ (Source power)/100 $W_2$ (bias power)/50 Ar (sccm of Ar gas flow)/300$N_2$ (sccm of $N_2$ gas flow)/60 sec (etch time). That is, the plasma etch is operated at 400 mT with a source power feed operating at 500 W at a frequency of about 27 MHz to generate species (neutrals) and ions, and the second power feed operating at 100 W at a frequency of about 2 MHz for imparting energy to the ions that impact the underlying wafer surface. According to the invention, the bias power is optimally adjusted to initiate a vertical etch while maintaining a degree of lateral etch for reducing the LER. It is important to realize however, that the pressure, and etch chemistry is pertinent for realizing the neutral to ion flux ratio degree to achieve a lateral and vertical etch capable of reducing the LER. In the example "Significant" neutral to ion flux ratio condition, the etch chemistry is such that a small amount of Argon gas flow (50 sccm) is provided compared to Nitrogen (300 sccm) which tends to generate more reactive neutrals without changing the amount of ions. As shown in the process condition formula (of FIG. 5), the etch time condition is indicated as 60 seconds for etching about half of the 200 nm thick ARC layer 18 as shown in the example of FIG. 4.

The reduction of post lithographic CD non-uniformity is made feasible as the employed plasma process is such that the ratio of the flux of reactive neutral species (effectively the rate of chemisorption occurring at the material surface) to that of ionic species (effectively the rate of sputtering of volatile adsorbates) exceeds some threshold value facilitating an increase degree of etch isotropy. It is understood that the etch conditions are dependent upon the DFC platform implemented. For instance, a DFC platform for achieving "significant" neutral to ion flux ratio condition may require source frequencies of 27 MHz or greater at powers ranging from about 100 W–500 W; bias frequencies ranging between 2 MHz to 13.56 MHz at powers less than about 100 W; Nitrogen gas flows ranging between about 300 sccm–1000 sccm and Argon gas flows of about 100 sccm or less. It is understood that the process gases described are such that any of $N_2$, $H_2$, $O_2$ gases, or combinations thereof, may be utilized. Further, other process conditions may include depositing gases such as $CHF_3$ or $CH_2F_2$ or $CH_3F$, or combinations thereof, in conjunction with $N_2$ or $H_2$ or $O_2$ or combinations thereof.

The increased degree of etch isotropy implies increased lateral etching of the ARC layer reducing the post lithographic LER. It is understood that the specific conditions required on an alternative DFC platform for achieving a "significant" neutral to ion flux ratio so as to reduce post lithographic LER may vary due to tool-to-tool differences. Such differences include chamber volume, pumping speed; line conductance; frequency of power feeds; chamber configurations, etc.

Advantageously, the plasma etch process adapted for achieving a significant neutral to ion flux ratio can be implemented for 90 nm and beyond BEOL and additionally, FEOL and MOL technologies (193 nm and future lithography) in which advanced plasma processing is utilized to reduce post lithographic CD non-uniformity LER in semiconductor devices.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

The invention claimed is:

1. A method for improving critical dimension (CD) uniformity of post lithographic structure comprising the step of implementing a dual frequency capacitive plasma etch process for etching a post lithographic structure at process conditions adapted to reduce the root-mean-square (RMS) line edge roughness (LER) of the resulting post lithographic structure, wherein said dual frequency capacitive (DFC) plasma etch process is applied to a spin-on or CVD-type anti-reflective coating (ARC) material underlying a patterned post lithographic structure, said method comprising tailoring a plasma etch chemistry such that a significant neutral to ion flux ratio of chemically reactive species is achieved whereby a rate of chemisorption of the reactive species onto an ARC material surface is greater than a rate of sputtering of volatile adsorbates from the surface thereby facilitating increased etch isotropy and resulting in reduced CD non-uniformity and uniform line width variation.

2. The method as claimed in claim 1, in which a plasma etch process conditions are adapted to reduce RMS LER of the resulting post lithographic structure by 19% or greater.

3. The method as claimed in claim 2, wherein said plasma etch process conditions are adapted to reduce RMS LER of the resulting post lithographic structure to a value between 0.5 nm to about 11 nm.

4. The method as claimed in claim 1, wherein said process conditions are adapted to ensure subsequent conformal liner and Cu seed deposition subsequent to etching said post lithographic structure.

5. The method as claimed in claim 1, adapted for implementation in 193 nm lithography processes or less.

6. The method as claimed in claim 1, wherein said dual frequency capacitive (DFC) plasma etch process conditions for achieving significant neutral to ion flux ratio includes providing a source power at a frequency of 27 MHz or greater and a bias power at a frequency ranging between 2 MHz to 13.5 MHz.

7. The method as claimed in claim 6, wherein said DFC plasma etch process conditions for achieving significant neutral to ion flux ratio includes providing pressure ranges of between 300 mT to 1000 mT.

8. The method as claimed in claim 6, wherein said DFC plasma etch process conditions for achieving significant neutral to ion flux ratio includes providing source power ranging between 100 W to 500 W.

9. The method as claimed in claim 6, wherein said DFC plasma etch process conditions for achieving significant neutral to ion flux ratio includes providing bias power at less than 100 W.

10. The method as claimed in claim 6, wherein said DFC plasma etch process conditions for achieving significant neutral to ion flux ratio includes providing a $N_2$ flow ranging between 300 sccm to 1000 sccm.

11. The method as claimed in claim 6, wherein said DFC plasma etch process conditions for achieving significant neutral to ion flux ratio includes providing an Ar flow at less than 100 sccm.

12. The method as claimed in claim 6, wherein said DFC plasma etch process conditions for achieving significant neutral to ion flux ratio includes utilizing process gases comprising any nitrogen, hydrogen, oxygen containing gas or combinations thereof.

13. The method as claimed in claim 12, wherein said DFC plasma etch process conditions for achieving significant neutral to ion flux ratio includes utilizing a deposition gas comprising $CHF_3$ or $CH_2F_2$ or $CH_3F$ or combinations thereof, in conjunction with said nitrogen, hydrogen, oxygen containing gas or combinations thereof.

* * * * *